(12) United States Patent
Zemel

(10) Patent No.: US 6,545,744 B2
(45) Date of Patent: Apr. 8, 2003

(54) TWO-SIDED SUBSTRATE IMAGING USING SINGLE-APPROACH PROJECTION OPTICS

(75) Inventor: Marc I. Zemel, Bedminster, NJ (US)

(73) Assignee: Anvik Corporation, Hawthorne, NY (US)

( * ) Notice: Subject to any disclaimer, the term of this patent is extended or adjusted under 35 U.S.C. 154(b) by 0 days.

(21) Appl. No.: 09/879,720

(22) Filed: Jun. 12, 2001

(65) Prior Publication Data

US 2002/0024642 A1 Feb. 28, 2002

Related U.S. Application Data

(62) Division of application No. 09/520,393, filed on Mar. 8, 2000, now Pat. No. 6,356,337.

(51) Int. Cl.[7] .......................... G03B 27/32; G03B 27/42
(52) U.S. Cl. ................................ 355/26; 355/53
(58) Field of Search .................... 355/53, 26, 72–77; 414/416, 749, 757, 217, 222

(56) References Cited

U.S. PATENT DOCUMENTS

| | | | | |
|---|---|---|---|---|
| 3,937,579 A | * | 2/1976 | Schmidt | 356/144 |
| 5,105,147 A | * | 4/1992 | Karahikov et al. | 324/158 |
| 5,610,683 A | * | 3/1997 | Takahashi | 355/53 |
| 5,740,059 A | * | 4/1998 | Hirata et al. | 364/478.01 |
| 5,759,006 A | * | 6/1998 | Miyamoto et al. | 414/416 |
| 5,923,403 A | * | 7/1999 | Jain | 355/26 |

* cited by examiner

Primary Examiner—Henry Hung Nguyen
(74) Attorney, Agent, or Firm—Carl C. Kling

(57) ABSTRACT

Apparatus and method for side-by-side scanning of substrate panels to use a single-approach projection optical system to provide a patterned image on each of two substrate surfaces. More particularly, the system provides a technique for pattern scanning obverse and reverse surfaces, patterning one substrate surface, inverting the substrate panel and repositioning the substrate panel for patterning the opposite substrate surface. The inversion provides access to both surfaces of a substrate panel for pattern scanning by the same optics and the same precision x-y stage in quick succession. The system positions the same substrate panel inverted, or another substrate panel, as required, twice at one station or sequentially at first and second stations. The flipping mechanism may be a simple grabber/retractor with a rotatable wrist for substrate inverting; the stage selects the imaging station. Forwarders may be Inexpensive standard pick-and-place, slide-shuttle or carousel loader/unloader mechanisms.

4 Claims, 2 Drawing Sheets

TWO-SIDED SUBSTRATE IMAGING USING SINGLE-APPROACH PROJECTION OPTICS

CROSS-REFERENCE TO RELATED APPLICATIONS

This application is a division of application number 09/520,393, filed Mar. 8, 2000, now U.S. Pat. No. 6,356,337, Zemel, TWO-SIDED SUBSTRATE IMAGING USING SINGLE-APPROACH PROJECTION OPTICS, Mar. 12, 2002.

STATEMENT REGARDING FEDERALLY SPONSORED RESEARCH OR DEVELOPMENT (Not Applicable.)

REFERENCE TO A MICROFICHE APPENDIX (Not Applicable.)

BACKGROUND OF THE INVENTION (1) Field of the Invention

This invention relates to a technique to provide high-resolution patterned images on each of obverse and reverse (generally top and bottom) surfaces of substrate panels using single-approach projection optics and a scanning stage, and more particularly relates to apparatus and method for flipping the substrate over, to provide access to a second surface of the substrate for pattern scanning, while retaining the registration and resolution advantages of having obverse and reverse of each substrate panel patterned in quick succession with the same projection optics scanned by the same stage carriage.

(2) Description of Related Art

State of the art microelectronics patterning systems follow the lead of U.S. Pat. No. 4,924,257, Scan and Repeat High Resolution Lithography System, Jain, May 08, 1990. Dr. Jain teaches the use of a treated beam of laser radiation for patterning a substrate according to a mask, both mask and substrate being scanned line-by-line by a small hexagonal field in overlapping complementary scans, for balanced illumination of the mask pattern on a photoresist on the surface of the substrate.

The desire to form such microlithographed patterns on both surfaces of a substrate, typically a thin, flat, non-flexible printed circuit board or microchip, is both stated and solved in U.S. Pat. No. 5,923,403. Simultaneous, Two-Sided Projection Lithography System, Jain, Jul. 13, 1999. Jain splits the radiation beam of a laser, and by light-beam directing projection optical systems applies patterning radiation simultaneously through separate masks to both sides of the flat substrate. The obverse and reverse surfaces of a substrate panel are simultaneously patterned by dual optical projection systems. One of the optical projection systems has an up-approach, through a see-through window in the stage carriage. The other optical projection system has a down-approach.

There is another way to divide the laser beam. U.S. Pat. No. 5,933,216, Double-Sided Patterning System using Dual-Wavelength Output of an Excimer Laser, Dunn, Aug. 3, 1999, splits the laser beam into two different peak-power wavelengths and forwards the separated beams along separate optical projection systems for the two sides of the substrate. The differing wavelengths of radiation require either a broadband photoresist or a separate photoresist for obverse and reverse, each optimized for a respective one of the two wavelengths. Two substrates may be accessed at one time, in one embodiment by up-approach and down-approach projection optical systems—and in another embodiment by side-by-side down-approach projection optical systems, but for single sides only of the two substrate panels.

BRIEF SUMMARY OF THE INVENTION

The two-sided projection lithography systems identified above provide for very high quality two-sided microelectronics patterning, mutually registered, with high throughput. They are most cost-effective in relatively long production runs. There remains, however, a continuing desire for simplicity and economy in two-sided high-resolution patterning, both aspects being economized by having single-approach optics and a simple stage carriage, with 1:1 projection optics, for mask and substrate.

The desire continues for a simple system for high-resolution patterning of two-sided substrates, which has a single set of projection optical system, provides easy two-side registration, and is economical for relatively short patterning runs.

It is the object of the invention to provide, in a novel microelectronics patterning system, electromechanical positioners to flip the substrates for economical two-side high-resolution patterning by a single set of projection optics.

Another object of the Invention is to provide a novel method for positioning and repositioning substrates for two-sided patterning, during a single production run, by flipping the substrates for patterning by a single-approach set of projection optics.

A feature of the invention is the use, in a simplified embodiment, of a single feeder/flipper/forwarder to load, flip, reposition and unload the substrate panels on the stage carriage which provides scanning motion of the substrates with respect to the projection optics and the masks.

Another feature of the invention is the use, in a second embodiment in which the economics favor separate feeders for loading and unloading, and a flipper/forwarder for repositioning the substrate after the first side has been patterned, for patterning the second side.

An advantage of the invention is that the costly portions of the system do not have to be replicated, but rather are time-shared as a result of the inventive hardware and method.

Another advantage is that there is no need for a see-through window in the stage carriage, allowing for simpler and more powerful substrate grasp by vacuum.

A significant advantage in economy arises from the ease with which this invention can be retrofitted on existing single-approach lithography systems, by alteration of programming in the control computer together with addition of relatively inexpensive flipper mechanisms to existing substrate feeder mechanisms, or by replacement feeder/flipper/forwarder mechanisms.

Other objects, features and advantages of the invention will be apparent from the following written description, claims, abstract and the annexed drawings.

DETAILED DESCRIPTION OF THE INVENTION

Figure 1:
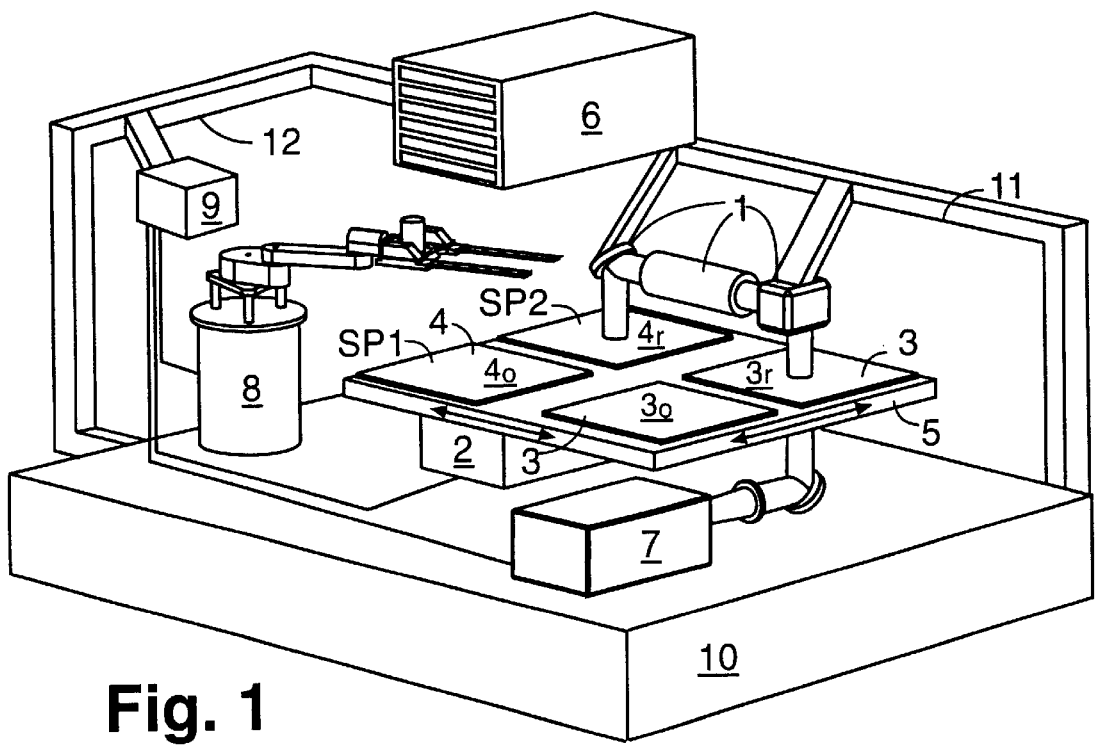
FIG. 1 is a perspective view of the system.

FIG. 1 is a perspective view of the system, showing projection optics 1 and stage 2. Stage 2 provides scanning motion with respect to optics 1. Two masks 3 (each mask carrying a first pattern 3-1 or a second pattern 3-2) are shown locked in place on stage 2. Stage 2 also carries one or two substrate panels 4 in patterning positions. Each substrate panel 4 has a first (obverse) side $4_o$ and a second (reverse) side $4_r$. Two substrate panels SP1 and SP2 are in patterning positions for $4_o$ and $4_r$ are shown. Postulate that patterning has been completed on both surfaces of substrate SP1, which is ready to be removed. The usual intent is to project separate pattern images of ultraviolet radiation, patterned according to separate obverse pattern mask and reverse pattern mask, onto photosensitive layers on the obverse and reverse of each substrate, to characterize a microcircuit pattern. Procedures may vary, but the usual procedure is to:

unload/flip/forward/load substrate panels;

project the image of the obverse pattern $3o$ onto obverse side $4o$ of the substrate panel 4 at patterning station SP1 and project the image of the reverse pattern $3r$ onto the reverse side $4r$ of the substrate panel 4 at patterning station SP2;

then flip the substrate panel at SP1 over, preferably to a new position, SP2, on the vacuum-operated substrate chuck carriage 5 of stage 2; and then project the image of the obverse pattern $3o$ onto obverse side $4o$ of the substrate panel 4 at patterning station SP1 and project the image of the reverse pattern $3r$ onto the reverse side $4r$ of the substrate panel 4 at patterning station SP2; and repeat for each of the substrates SP1, SP2 . . . SPn until all substrates SP1, SP2 . . . SPn have been patterned on both obverse and reverse surfaces.

This procedure continues, as substrates SP1, SP2 . . . SPn are in turn loaded, patterned, flipped, patterned, and unloaded. Substrates SP1, SP2 . . . SPn are taken from a supply/return rack 6, mounted on stage 2 carriage 5 in position for pattern imaging, patterned, flipped, patterned, unloaded and returned to supply/return rack 6. The patterning radiation beam, from laser 7, passes along beam-directing subsystem and through a scan path in one of masks $3o$ and $3r$. (Reverse mask $3r$ is shown in patterning position in FIG. 1, providing the reverse-side pattern to substrate SP2, The patterning radiation beam is patterned according to the mask (mask $3r$ is shown in position). The mask $3r$ and reverse side of substrate SP2 are scanned line-by-Line, preferably in the overlapping complementary scans of previously cited U.S. Pat. No. 4,924,257, Jain.

FIG. 1 postulates that the obverse side of substrate panel SP1 is ready to be patterned according to the pattern on mask $3_r$, and that a fully-patterned substrate panel SPO (not shown) has been previously returned to the supply/return rack 6. FIG. 1 also shows feeder/flipper/forwarder (loader/unloader) 8 for the system, and control unit 9. FIG. 1 shows stationary base 10, which typically is a heavy vibration-damping block which supports projection optics 1 by a bridge 11–12, provides the base for the feeder/flipper/forwarder (loader/unloader) 8, supports the supply/return rack 6 and supports the base of the stage 2. Feeder/flipper/forwarder 8 serves as means having the capability of inverting a substrate panel taken directly from a substrate chuck on a carriage and forwarded directly to a substrate chuck on said carriage.

Figure 2:
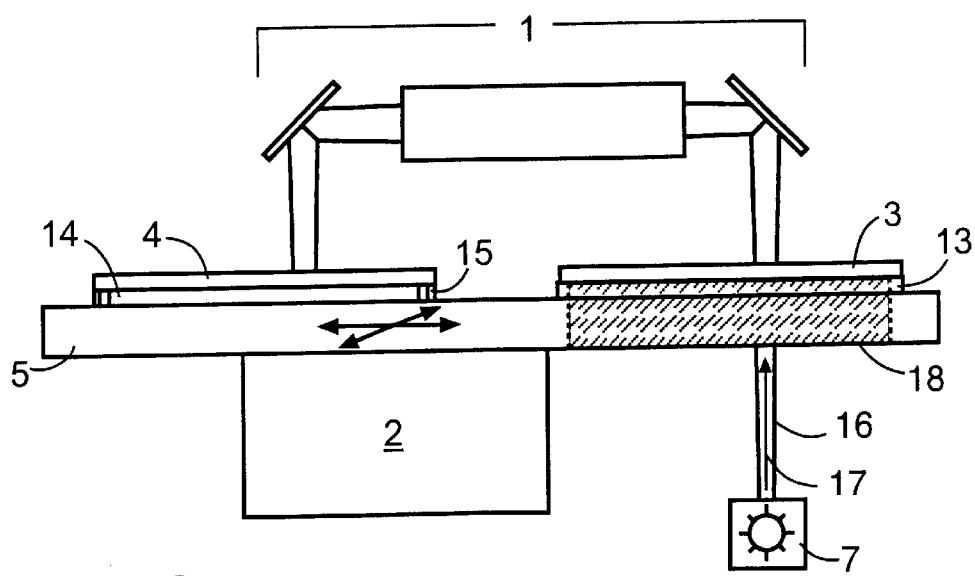
FIG. 2 is a partially schematic side elevation view, showing how masks and substrate panels are gripped during patterning exposures.
Figure 3:
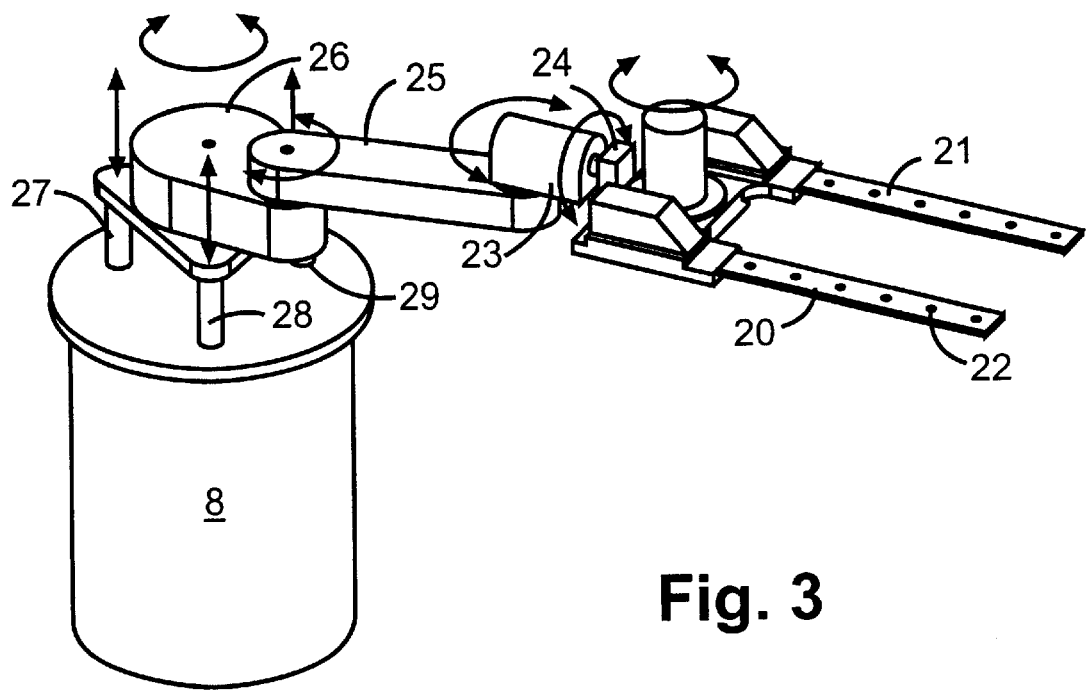
FIG. 3 is a perspective view of a preferred feeder/flipper/forwarder (loader/unloader) for the system.

FIG. 2 is a side elevation view, partially schematic, showing how the substrate panels and masks are supported for presentation. Masks 3 (with mask patterns $3_o$ & $3_r$) and substrates (SP1, SP2 . . . SPn) are carried on mask/substrate carriage 5. Mask/substrate carriage 5 is transparent to the activating radiation in the active area of the mask. Each mask 3 is held in place by a mask chuck 13. Each mask chuck 13 is also transparent in the active area for patterning. Substrate chuck 14, which generally is not transparent, holds the substrates in place, preferably by vacuum. Substrate chuck 14 is preferably equipped with vacuum shutoffs, and with substrate lifters or with both, to ease the process of unloading. Substrate lifters may be configured as simple pins 15 which may be caused to rise under inactive or kerf areas of the substrate, lifting the substrate panel out of influence of the substrate chuck vacuum, presenting the substrate panel for unloading. The patterning radiation passes from laser 7, through beam tunnel 16 as beam 17. Beam 17 passes through the transparent window 18 and the transparent or open window of mask chuck 13, through mask 3 and projection optics 1 to substrate panel 4. FIGS. 1–3 should be considered together. FIG. 1 shows the system. FIG. 2 shows details of stage 5 and projection optics 1, which are shown with less detail in FIG. 1. FIG. 3 shows details 20–29 of placement mechanism 8 which is also shown in FIG. 1.

Loader/Flipper/Forwarder/Unloader Robot

FIG. 3 Is a perspective view of the substrate panel handling robot, the feeder/flipper/forwarder (loader/unloader) in a preferred embodiment. The substrate panel handling robot was not shown in FIG. 2. Other configurations of substrate-handling devices, such as air jets, rollers or edge grippers, may also be effective, depending upon type of substrate, the type of substrate chuck and the type of loader/unloader.

The stage subsystem works to lock a plurality of masks and substrate panels (positions for two of each are shown in FIG. 1) on the carriage 5 of the stage 2, typically by vacuum. The stage subsystem also works to move those masks and substrate panels in a scanning pattern of motion with respect to projection optics 1, as is shown in U.S. Pat. No. 5,923, 403, Jain, cited above in the prior art section. A mask and substrate panel are scanned simultaneously, with registration guaranteed by having mask and substrate panel locked to the common stage carriage 5 for simultaneous scanning motion. Preferably, scanning is by a small hexagonal field, in the complementary overlapping mode taught by U.S. Pat. No. 4,924,257, Scan and Repeat High-Resolution Lithography System, Jain, May 8, 1990.

During repetitive operation as shown in FIG. 1, the first substrate panel SP1 is shown as if it had been previously scanned on its reverse surface, flipped over, repositioned to its present position, and scanned on its obverse surface, ready to be unloaded to the supply/return rack 6. Substrate panel SP2 has been positioned in the reverse-side position on the stage carriage 5. The system is now shown poised near the completion of a patterning scan of substrate panel SP2 (reverse surface) according to mask $3_r$.

After the substrate panel SP2 (reverse surface) has been patterned, substrate panel SP2 is flipped and repositioned for patterning the obverse according to mask $3_o$. Substrate panel SP2, during or after the flipping motion, is loaded into the obverse-patterning station for patterning of substrate panel SP1. This operation continues until the production run is finished.

Method of Operation

The above discussion postulates repetitive operation during an intermediate period of the production run. The following paragraphs will give some detail of beginning and finish of the production run.

Steps −1 & 0—Readiness, Reverse Patterning of SP2

At the beginning, (step=−1), the stage carriage 5 is empty of substrate panels but has obverse-mask $3_o$ and reverse-mask $3_r$ locked in their operative positions. A pre-load step may load a substrate panel in each of the patterning work stations $3_o$ and $3_r$.

Step 0 takes place after substrate panel SP2 has been loaded with its reverse surface facing the radiation beam passing through the reverse mask $3_r$.

At this time the stage carriage is fully loaded with two substrate panels, ready for the repetitive operation discussed above, and reviewed in the paragraph following this paragraph.

Step 1—Reverse Patterning of SP2 & Obverse Patterning of SP1

There are substrate panels at the reverse-patterning work station 4r and at the obverse-patterning work station 4o. Scanning takes place to place pattern images 4r and 4o on surfaces of substrate panels SP2 and SP1, respectively. When the scan has been completed, substrate panel SP1 is ready to be unloaded, substrate panel SP2 is ready to be flipped, and substrate panel SP2 is ready to be repositioned at the obverse work station, with its obverse facing the optical beam from the appropriate mask with pattern $3_o$.

Final Step—Emptying

At the finish, the reverse work station is empty and the obverse work station presents the last panel in the production run, substrate panel SPn obverse, for patterning. This panel is scanned for patterning, and then unloaded, completing the production run.

Simplified Embodiments

In a supersimplified embodiment, the reverse patterning station and the obverse patterning station are not separate, but their functions are combined at a single, two-side work station. There is preferably a single mask, the pattern of which ordinarily must be replicated on both sides of the substrate panel. After scanning, the substrate panel must be flipped (without forwarding) and repositioned, at the two-side work station, for patterning of the other surface of the substrate panel. Loading and unloading are as discussed above.

As another alternative, the mask must be changed after each panel surface has been scanned. This may be done manually, or may be accomplished by a mask chuck shuttle, by a carousel or by a loader/unloader from a n adjacent mask rack.

This loader and unloader may be any of several available substrate loaders which are currently marketed, or the load/unload functions can be handled by the same robot which accomplishes flipper/forwarder functions.

Figure 4:
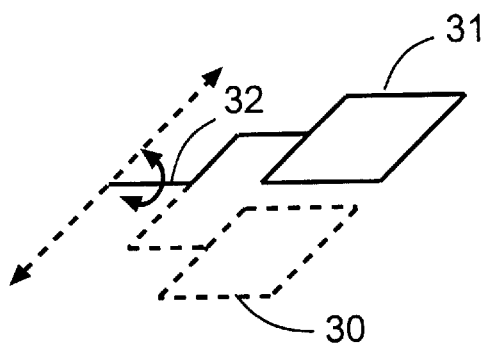
FIG. 4 is diagrammatic perspective view of flipper/forwarder flipping motions.

FIG. 4 is a perspective view of a simplified flipper/forwarder(loader/unloader), a single all-purpose pick-and-place robot with flipping capability. The flipper/forwarder, in this embodiment, is also used for loading and unloading. It addresses the substrate panel at the reverse work station, and flips the substrate panel over as it forwards It to the obverse work station. The flipper/forwarder preferably grasps the substrate panel by its sides or in the kerf areas, so as not to damage the photoresist layers and to stay out of the way when the substrate panel is transferred to the stage platform. If the photoresist is protected by a transparent cover sheet, the flipper/forwarder may be a vacuum grabber that touches the cover sheet.

The positioned and repositioned substrate panels may require standard aligning techniques prior to pattern scanning.

FIG. 4 shows the motions of a preferred flipper/forwarder robot, which moves by an in-plane sliding motion, once the stage carriage has been withdrawn by stage action (or once the stage carriage has been left behind by vertical or horizontal motion of the robot holding the substrate panel). The sliding motion and the previous work station for the substrate panel are shown in dashed lines. With sufficient clearance above or alongside the stage carriage, the substrate panel 30 is flipped over (inverted) and forwarded to the subsequent work station 31 as shown by the small curved arrow and the solid lines. The 180° rotation of axle 32 provides the motion.

Figure 5:
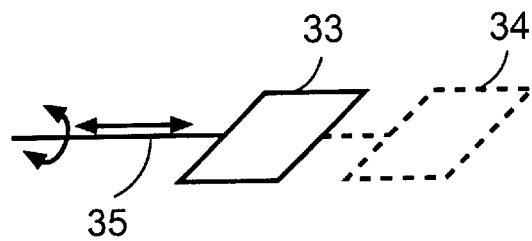
FIG. 5 is a schematic view of simplified flipper motions.

FIG. 5 shows the motions of an alternative in-station flipper robot, which moves by an in-plane sliding motion of substrate panel 33, once the stage carriage has been withdrawn by stage action (or once the stage carriage has been left behind by vertical or horizontal motion of the robot holding the substrate panel. The sliding motion and the previous location 34 of the substrate panel are shown in dashed lines. With sufficient clearance above or alongside the stage carriage, the substrate panel is moved out of the way of the stage carriage, flipped over. (inverted) by 180° rotation of axle 35 as shown by the small curved arrow, and returned, inverted, to the same action station (dashed lines) from the intermediate location shown by the solid lines.

Loading, positioning, forwarding and unloading the substrate panels are shown in ways suggesting pick-up and pass-off of each panel. Various slide forwarding and carousel forwarding mechanisms may also be used, with or without the cooperation of the stage carriage.

Flipping the substrate panels is shown by wrist rotation separate from the forwarding action. Other actions are also possible, such as elbow action or canted-loop action, where forwarding is achieved during the flip. If the substrate panels have sufficient flexibility, flipping and forwarding may be accomplished using a series of rollers to achieve a canted-loop path. The substrate panel must be lifted off its vacuum-locked position on the stage carriage, for the patterning of the obverse surface, and then flipped over and forwarded to the action station at the same or at the next substrate chuck position on the stage carriage.

METHOD OF REPETITIVE TWO-SIDED PATTERNING

Step 1=Unload two-side finished substrate panel from obverse patterning station.

Step 2=Flip reverse-side patterned substrate panel from reverse patterning station.

Step 3=Forward to obverse patterning station for presentation of obverse surface.

Step 4=Load blank substrate panel into reverse patterning station.

Step 5=Scan flipped reverse-side-finished substrate panel at obverse patterning station and scan blank substrate panel at reverse patterning station.

(Repeat Steps 1–5.)

[Note that Steps 2 and 3 above can be combined. See following discussion.]

METHOD OF REPETITIVE TWO-SIDED PATTERNING WITH FLIPPER/FORWARDER

Step 1=Unload two-side finished substrate panel from obverse patterning station.

Step 2=Flip and forward obverse-side finished substrate panel, in a single, complex motion, with the reverse-side finished substrate panel ending at the obverse patterning station, presenting substrate panel obverse-side.

Step 3=Load blank substrate panel into reverse patterning station.

Step 4=Scan flipped reverse-side finished substrate panel at obverse patterning station and scan blank substrate panel at side-1 reverse patterning station.
(Repeat Steps 1–4.)

METHOD OF REPETITIVE TWO-SIDED PATTERNING AT A SINGLE STATION, WITH FLIPPER/FORWARDER, DUAL-WAVELENGTH PHOTORESISTS, DUAL-WAVELENGTH RADIATION and TWO-MASK SHUTTLE Preparatory Steps=Arrange blank substrates alternatively reverse-side up and obverse-side up, reverse-side having photoresist optimized for a first wavelength, and obverse-side having photoresist optimized for a second wavelength, load obverse-side-up substrate in obverse patterning station and obverse-side-up substrate in obverse patterning station, pattern loaded substrates by scanning, and arrange reverse-side and obverse-side masks on a shuttle on the stage carriage;

Step 1=Unload reverse-side & obverse-side finished substrate panel, if any be present, from obverse patterning station;

Step 2=Flip and forward reverse-side-finished substrate panel, if any be present, in a complex motion, with the reverse-side-finished substrate panel ending at the obverse patterning station, presenting substrate panel obverse-side;

Step 3=Load blank substrate panel into obverse patterning station;

Step 4=Scan flipped reverse-finished substrate panel at obverse patterning station and scan blank substrate panel at reverse patterning station;
(Repeat Steps 1–4.)

Alternatively, a system can feature a substrate loader/unloader/flipper that could hold two substrates simultaneously. The operator loads two substrates onto the tool at one time, exposes both, flips both (and transfers both substrate panels to opposite work stations in the flipping step, exposes, both (opposite sides) and unloads both. Substrates could be arrayed alternatively, first side up/second side up, if necessary.

What is claimed is:

1. Apparatus for controlled two-sided mask pattern imaging of substrate panels, each substrate panel having two surfaces which may be designated obverse and reverse, said apparatus using loading means for positioning a substrate panel, having unloading means, having at least one mask station and having control means to direct imaging of a mask pattern onto a surface of a substrate panel, comprising:
   a) stage mechanism controllable to provide motions including scanning motions and positioning motions to a movable carriage, said carriage having substrate chuck means at positions including obverse and reverse imaging positions;
   b) a single-approach projection subsystem controllable to scan a selected mask image to the obverse surface of a substrate panel at said obverse imaging position and to scan a selected mask image to the reverse surface of a substrate panel at said reverse imaging position; and
   c) movable placement mechanism having controllable capability for taking a substrate panel from said obverse imaging position, inverting said substrate panel and returning said inverted substrate panel to said stage mechanism movable carriage at said reverse imaging position for a subsequent imaging scan of the reverse surface of said substrate.

2. Apparatus for repetitive two-sided mask patterning of substrate panels, according to claim 1,
   wherein said movable placement mechanism and said stage mechanism are controlled for feeder/flipper/forwarder/unloader functions.

3. Apparatus for controlled two-sided mask pattern imaging of substrate panels, each substrate panel having two surfaces which may be designated obverse and reverse, said apparatus using loading means for positioning a substrate panel, having unloading means, having at least one mask station and having control means to direct imaging of a mask pattern onto a surface of a substrate panel, comprising:
   a) stage mechanism controllable to provide motions including scanning motions and positioning motions to a movable carriage, said carriage having substrate chuck means at an imaging position;
   b) a single-approach projection subsystem controllable to scan a selected mask image to the obverse surface of a substrate panel at an imaging position; and
   c) movable placement mechanism having controllable capability for taking a substrate panel from said obverse imaging position, inverting said substrate panel and returning said inverted substrate panel to said stage mechanism movable carriage substrate chuck means at said imaging position for a subsequent imaging scan of the reverse surface of said substrate.

4. Apparatus for repetitive two-sided mask patterning of substrate panels, according to claim 3,
   wherein said movable placement mechanism and said stage mechanism are controlled for feeder/flipper/unloader functions.

* * * * *